US005801653A

United States Patent [19]

Liu et al.

[11] Patent Number: 5,801,653

[45] Date of Patent: Sep. 1, 1998

[54] CURRENT CELL OF A DIGITAL-TO-ANALOG CONVERTER

[75] Inventors: Ding-Jeng Liu; Ying-Tzung Wang; Wen-Hsin Cheng, all of Hsinchu, Taiwan

[73] Assignee: United Microelectronics Corporation, Taiwan

[21] Appl. No.: 728,561

[22] Filed: Oct. 10, 1996

[51] Int. Cl.$^6$ .................. H03M 1/66

[52] U.S. Cl. .................. 341/136; 341/144

[58] Field of Search .................. 341/136, 120, 341/118, 172, 144; 327/206

[56] References Cited

U.S. PATENT DOCUMENTS 5,592,167 1/1997 Caruso et al. .................. 341/159

5,654,710 8/1997 Oh et al. .................. 341/136

*Primary Examiner*—Marc S. Hoff
*Assistant Examiner*—Peguy JeanPierre
*Attorney, Agent, or Firm*—Fish & Richardson P.C.

[57] ABSTRACT

A current cell for converting a digital signal to an analog current signal is disclosed. The current cell includes a first PMOS transistor which receives the digital signal from a pre-stage processor by the gate. A drain of the first PMOS transistor is grounded. A second PMOS transistor has a source which is connected to the source of the first PMOS transistor, a gate which receives an inverse signal of the digital signal from the pre-stage processor, and a drain for providing the analog current signal. A third PMOS transistor is connected between a voltage source and the source of the first PMOS transistor. The third PMOS transistor has a gate to which a first reference voltage is applied.

6 Claims, 3 Drawing Sheets

CURRENT CELL OF A DIGITAL-TO-ANALOG CONVERTER

BACKGROUND OF THE INVENTION

1. Field of the Invention

The present invention relates to digital-to-analog (D/A) converters and, more specifically, to a current cell of a D/A converter.

2. Description of the Prior Art

Digital signals can be rapidly and easily processed in electronic data processing devices, such as computers or fax machines, which are increasingly becoming part of everyday life. The digital signals are not comprehensible, however, if the electronic devices output them directly. They must be converted into analog signals so that they appear as figures or sound, to be understandable. Therefore, a digital-to-analog (D/A) converter is a very important part of electronic devices for communicating with people.

Among the many known D/A converters, one which includes a combination of a number of current cells, each of which provides a high or a low current level to be summed up as the analog current signal, has reduced the complexity of the circuit design. For example, referring to the circuit structure of a conventional current cell 10 illustrated in FIG. 1, only three transistors are required to constitute the circuit. Current cell 10 is connected to a pre-stage processor 70 and is biased by a bias circuit 60.

Current cell 10 includes three PMOS transistors M20, M21 and M22. The source of PMOS transistor M20 is connected to a voltage source VDD. A first reference voltage from bias circuit 60 is applied to the gate. Therefore, transistor M20 can be turned on to provide a channel current I7. The sources of transistors M21 and M22 are connected together to the drain of transistor M20, i.e., point K as shown in the figure. Another reference voltage from bias circuit 60 is applied to the gate of transistor M21, i.e., point Y. The drain of PMOS transistor M22 is grounded. A digital signal from pre-stage processor 70 enters the gate of transistor M22, and then an output current is provided by the drain of transistor M21. In the figure, the gate of transistor M22, i.e., the digital signal input end, is point X.

When the input digital signal is a high level signal, transistor M22 will be turned off. Therefore, current I7 goes through transistor M21 to output. That is, channel current I6 of transistor M22 equals nearly null, while channel current I5 of transistor M21 is the same as channel current I7. Alternatively, when the input signal is low, transistor M22 will be turned on to release channel current I7, and transistor M21 is about to be turned off to shut off channel current I5. That is, the circuit inclines to make I6=I7 and I5=0. Therefore, when the input digital signal is high, a high current output will be provided, or when the input digital signal is low, a low current will be outputted from current cell 10. Thus, the output current level of current cell 10 is proportional to the input digital signal level.

Since current cell 10 receives input signals from single end X, the two transistors M21 and M22 are not symmetrically operated, and the voltage at point K varies as the input signal level changes. In other words, for a low input signal, the gate voltage of transistor M22 is zero. However, when the input signal goes high, the gate voltage of transistor M21 does not decrease to zero, as bias circuit 60 continues to maintain the reference voltage. The voltage level at point K therefore depends on the on/off states of transistor M22. Since parasitic capacitance $C_{gs}$ exists between the source and gate ends of any MOS transistor, the voltage variation at point K will couple with capacitance $C_{gs}$, which affects the performance of current cell 10. Moreover, if a spike appears in the input digital signal, the output current will fully reflect the abnormal input signal, resulting in error output data because the current cell has no protection when a spike occurs at input end X.

SUMMARY OF THE INVENTION

The present invention provides a dual-input current cell for a digital-to-analog converter which eliminates the influence of the parasitic capacitance, thereby improving the performance of the digital-to-analog converter.

The present invention also provides a current cell for a digital-to-analog invertor to prevent voltage variation during an input signal transient.

The current cell of the present invention can further reduce the influence of input spikes, thereby improving the performance of the digital-to-analog converter.

The current cell of the present invention transforms a digital signal from a pre-stage processor into an analog current signal. The current cell includes a first PMOS transistor which has a gate that receives the digital signal from the pre-stage processor. The drain of the first PMOS transistor is grounded. A second PMOS transistor has a source which is connected to the source of the first PMOS transistor, a gate which receives an inverse signal of the digital signal from the pre-stage processor, and a drain for providing the analog current signal. A third PMOS transistor is connected between a voltage source and the source of the first PMOS transistor. A first reference voltage is applied to the gate of the third PMOS transistor.

BRIEF DESCRIPTION OF THE DRAWINGS

Other objects, features, and advantages of the present invention will become apparent from the following detailed description of the preferred but non-limiting embodiment. The description is made with reference to the accompanying drawings, in which.

DESCRIPTION OF THE PREFERRED EMBODIMENTS

Figure 1:
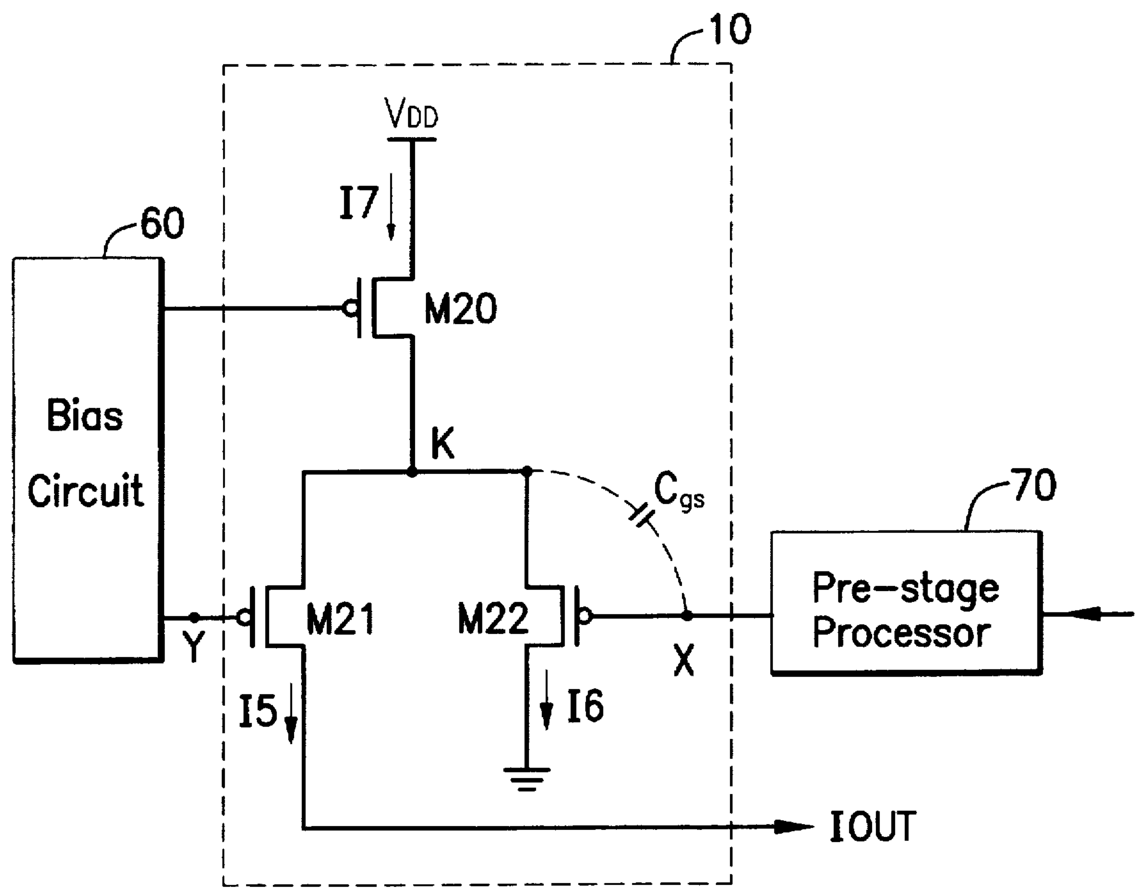
FIG. 1 illustrates the circuit structure of a conventional current cell.
Figure 2:
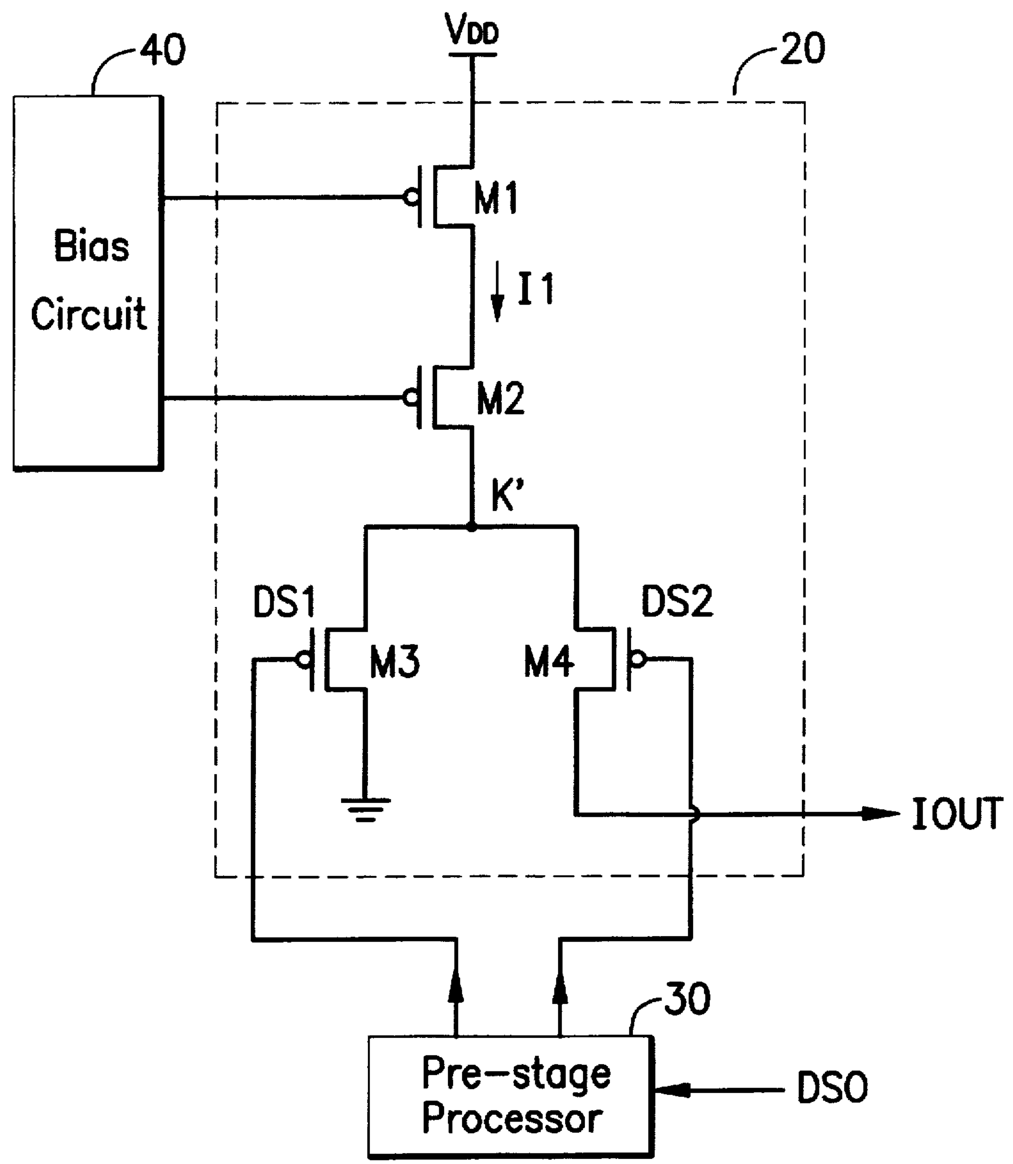
FIG. 2 illustrates the circuit structure of the current cell made according to a preferred embodiment of the present invention.

The current cell circuit of a preferred embodiment of the present invention is illustrated in FIG. 2. Referring to the figure, a current cell 20 has four PMOS transistors M1–M4. A first PMOS transistor and a second PMOS transistor, i.e., transistors M3 and M4, are provided for receiving digital signals DS1 and DS2 from a pre-stage processor 30.

The source of a third PMOS transistor M1 is applied with a voltage VDD. The source of a third PMOS transistor M2 is connected to the drain of transistor M1. Each gate of transistors M1 and M2 is connected to a first reference voltage via a bias circuit 40. Both transistors M1 and M2 act as current sources to supply current I1 in current cell 20. They can be replaced by a single third PMOS transistor to which a first reference voltage is applied, if the dimensions of the circuit must be scaled down. However, the arrangement of a plurality of third PMOS transistors can increase the output impedance of the current source so as to stabilize the amplitude of current I1.

The gates of transistors M3 and M4 receive input signals DS1 and DS2 from a pre-stage processor 30. The sources of transistors M3 and M4 are connected to the drain of transistor M2, i.e., node K' as shown in FIG. 2. The drain of transistor M3 is grounded. Therefore, an output current IOUT of current cell 20 is provided by the drain of transistor M4. Input digital signals DS1 and DS2 are generated by processing an original digital signal DS0 in pre-stage processor 30. The voltage levels of signals DS1 and DS2 depend on the threshold voltage for turning on transistors M3 and M4. Therefore, when the voltage level of signal DS1 is high and that of signal DS2 is low, transistor M3 is turned off, transistor M4 is on, and output current IOUT is almost equal to I1. Alternatively, when the voltage level of signal DS1 is low and that of signal DS2 is high, transistor M3 is turned on, transistor M4 is off, and output current IOUT is almost null.

Figure 3:
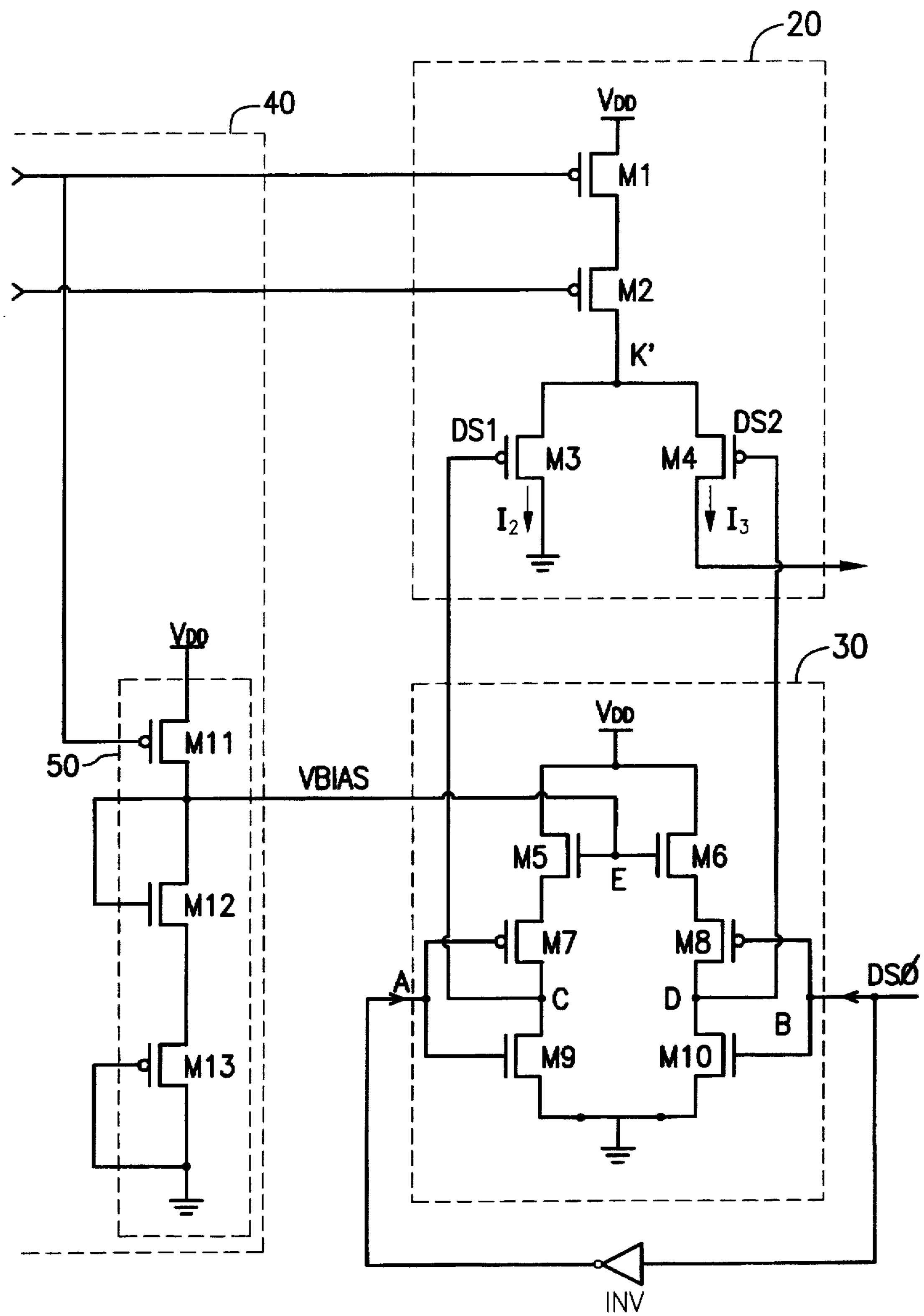
FIG. 3 illustrates the circuit configuration of the current cell, the pre-stage processor and the bias circuit of FIG. 2.

An example including the preferred circuit configuration of pre-stage processor 30 and a portion of bias circuit 40 is illustrated in FIG. 3. Current cell 20 in FIG. 3 is the same as that illustrated in FIG. 2. Pre-stage processor 30 includes a first NMOS transistor M10, a second NMOS transistor M9, a third NMOS transistor M6, a fourth NMOS transistor M5, a fourth PMOS transistor M8, and a fifth PMOS transistor M7 for generating digital signals DS1 and DS2 from original digital signal DS0.

A second reference voltage VBIAS is applied via bias circuit 40 to the junction of the gates of NMOS transistors M5 and M6 of pre-stage processor 30. Voltage VDD is applied to the drains of transistors M5 and M6. PMOS transistor M7 and NMOS transistor M9 form a second CMOS invertor in which the input signal is the inverse signal of DS0 and the output signal is signal DS1. Similarly, PMOS transistor M8 and NMOS transistor M10 form a first CMOS invertor, the input signal of which is signal DS0 and the output signal of which is signal DS2. The source of transistor M7 is connected to the source of NMOS transistor M5. The source of transistor M8 is connected to the source of transistor M6. The sources of transistors M9 and M10 are grounded.

Two reference voltages from bias circuit 40 are applied to transistors M1 and M2, respectively. The portion of bias circuit 40 shown in FIG. 3, i.e., circuit 50, includes a sixth PMOS transistor M11, a fifth NMOS transistor M12, and a seventh PMOS transistor M13. One of the two reference voltages is applied to the gate of PMOS transistor M11. The source of transistor M11 is connected to voltage source VDD. The gate and drain of NMOS transistor M12 are connected to the drain of transistor M11 to provide second reference voltage VBIAS. The source of PMOS transistor M13 is connected to the source of transistor M12. The gate and drain of PMOS transistor M13 are grounded.

The circuit illustrated in FIG. 3 prevents the problems that occur in the prior art. For example, the voltage at node K' of current cell 20 does not vary when the voltage levels of signals DS1 and DS2 change. The feed-through voltage between the gate of transistor M4 and the drain capacitance can be reduced because the differences between high and low levels of the input digital signals are smaller. Moreover, since the circuit has a symmetrical configuration, the operation of the circuit is immune from the variation of process conditions. The symmetrical configuration further reduces the influence of input spikes.

In the preferred embodiment of the present invention, the channel dimensions of PMOS transistor M11 are the same as those of transistor M1. The gates of transistor M1 and M11 are applied with the same reference voltage. The channel dimensions of PMOS transistor M13 are the same as those of transistors M3 and M4. Therefore, the voltage at node K' is fixed. The voltage level of node K' will be analyzed as follows.

When digital signal DS1 is low and signal DS2 is high, transistor M3 is turned on and transistor M4 is turned off. Therefore, drain current I3 of transistor M4 is almost null. Since the current provided by current sources M1 and M2 flows through transistor M3, drain current I2 of transistor M3 is almost the same as the current through node K'. Supposing the voltage at node K' to be VK1, drain current I2 of transistor M3 can be obtained from eq. (1).

$$I2 = \frac{\beta_3}{2}\,[VK1 - V_{TP}]^2 \qquad (1)$$

Thus, voltage VK1 at node K' can be $$VK1 = V_{TP} + \sqrt{I\frac{2}{\beta_3}}\ ,\ \text{with}\ \beta_3 = \frac{1}{2}\frac{W3}{L3}\,\mu C_{ox} \qquad (2)$$

wherein $V_{TP}$ is the threshold voltage of transistor M3, W3 is the channel width of transistor M3, L3 is the channel length of transistor M3, $\mu$ is the hole mobility, and $C_{ox}$ is unit capacitance of the gate oxide layer of transistor M3.

Alternatively, when signal DS1 is high and signal DS2 is low, transistor M4 is turned on and transistor M3 is off. Therefore, drain current I3 of transistor M4 is almost the same as the current flowing through node K', and drain current I2 of transistor M3 is null. The voltage at node K' for this moment is VK2. Similarly as in the previous analysis, voltage VK2 can be derived as eq. (3).

$$VK2 = V_{TP} + \sqrt{I\frac{2}{\beta_4}}\ ,\ \text{with}\ \beta_4 = \frac{1}{2}\frac{W4}{L4}\,\mu C_{ox} \qquad (3)$$

wherein W4 is the channel width of transistor M4 and L4 is the channel length of transistor M4. Since the channel dimensions of transistors M3 and M4 are the same in the present embodiment, the device parameters of the two transistors, such as $\beta_3$ and $\beta_4$, are also the same. Therefore, VK1 equals VK2. That is, the voltage at node K' does not change for different input voltage levels.

Pre-stage processor 30 of the present invention can reduce the voltage levels of signals DS1 and DS2 to a lowest acceptable level. Therefore, when signal DS1 changes from high to low and DS2 from low to high, or when DS1 changes from low to high and DS2 from high to low, the charges fed through the gates of transistors M3 and M4 due to the parasitic capacitance can be compensated by the symmetrical device configuration. That is, the voltage at node K' does not vary during the transient state of current cell 20. Moreover, the variation of drain current I3 of transistor M4 due to gate feed-through charges can be reduced because the voltage level of input signal DS2 is lowered. Therefore, an erroneous output current can be avoided and current cell 20 can generate a precise analog current signal according to the input digital signal.

In order to minimize the difference of operating voltage levels in current cell 20, the channel widths of transistors M3, M4 and M13 should be as small as possible. Since the smaller channel width can reduce the parasitic capacitance in the transistor, the erroneous drain current caused by feed-through charges, which depends on the parasitic capacitance, can also be reduced. Therefore, the performance of current cell 20 can be optimized. In the present invention, a preferred high voltage level of digital signals DS1 and DS2 is about $$\sqrt{I\frac{2}{\beta'}}+V_{TP}\ .$$

This equals the voltage at node K', and can completely turn off the channel of transistor M3 or M4 to eliminate the leakage current.

In cell 30, the gate voltage of M5 (M6) is equal to Vbias which is smaller than $V_{DD}$, and the gate voltage of M9 (M10) may be $V_{DD}$ or GND, one can conclude that the pull high strength is weaker than the pull low strength at node DS1 or DS2. When a spike occurs in original digital signal DS0, the suddenly very high or low voltage will appear at both input ends of current cell 20. That is, transistors M3 and M4 may be turned on at the same time. The current provided by current sources M1 and M2 will be separated into two flows to go through transistors M3 and M4, respectively. Therefore, the output current of current cell 20 is about one half of that in a normally on-state. Since the normal output current of current cell 20 includes two levels, that is, the output current is either full scale or null, one half of the full scale does not cause an abrupt variation in total output current so that the spike effect can be smoothed.

What is claimed is:

1. A current cell for transforming a digital signal from a pre-stage processor into an analog current signal, comprising a first PMOS transistor including a source, a gate receiving the digital signal from the pre-stage processor and a grounded drain;

a second PMOS transistor having a source connected to the source of the first PMOS transistor, a gate receiving an inverse signal of the digital signal from the pre-stage processor, and a drain for providing the analog current signal;

a third PMOS transistor connected between a voltage source and the source of the first PMOS transistor, the third PMOS transistor having a gate to which a first reference voltage is applied; wherein the pre-stage processor comprising a first CMOS invertor, including a fourth PMOS transistor and a first NMOS transistor, having an input end, and output end, a positive end, and a negative end, wherein the input end receives an original digital signal, the input end is grounded;

a second CMOS invertor, including a fifth PMOS transistor and a second NMOS transistor, having an input end, an output end, a positive end, and a negative end, wherein the input end receives and inverse signal of the original digital signal, the output end provides an inverse signal of the digital signal, and the negative end is grounded;

a third NMOS transistor having a drain connected to the voltage source, a gate for applying a second reference voltage, and a source connected to the positive end of the first CMOS invertor; and a fourth NMOS transistor having a gate connected to the gate of the third NMOS transistor, a drain being connected to the voltage source, and a source connected to the positive end of the second CMOS inserters.

2. A current cell according to claim 1, wherein the third NMOS transistor has channel dimensions equalling the channel dimensions of the fourth NMOS transistor.

3. A current cell according to claim 1, including a bias circuit for providing the second reference voltage, the bias circuit including:

a sixth PMOS transistor having a drain, a source connected to the voltage source and a gate to which the first reference voltage is applied;

a fifth NMOS transistor having a drain and a gate connected to the drain of the sixth PMOS transistor; and a seventh PMOS transistor having a source connected to the source of the fifth NMOS transistor, and a drain and a gate which are grounded.

4. A current cell according to claim 3, wherein the sixth PMOS transistor has channel dimensions which equal channel dimensions of the third PMOS transistor, and the seventh PMOS transistor has channel dimensions which equal channel dimensions of the first PMOS transistor and the second PMOS transistor.

5. A current cell for transforming a digital signal from a pre-stage processor into an analog current signal, comprising;

a first PMOS transistor including a source, a gate receiving the digital signal from the pre-stage processor and a grounded drain;

a second PMOS transistor having a source connected to the source of the first PMOS transistor, a gate receiving an inverse signal of the digital signal from the pre-stage processor, and a drain for providing the analog current signal;

a plurality of third PMOS transistors connected in series between a voltage source and the source of the first FMOS transistor, the third PMOS transistors having gates to which a first reference voltage is applied; wherein the pre-stage processor comprising a first CMOS invertor, including a fourth PMOS transistor and a first NMOS transistor, having an input end, and output end, a positive end, and a negative end, wherein the input end receives an original digital signal, the Input end provides the digital signal, and the negative end is grounded;

a second CMOS inverter, including a fifth PMOS transistor arid a second NMOS transistor, having an input end, an output end, a positive end, and a negative end, wherein the input end receives and inverse signal of the original digital signal, the output end provides an inverse signal of the digital signal, and the negative end is grounded;

a third NMOS transistor having a drain connected to the voltage source, a gate for applying a second reference voltage, and a source connected to the positive end of the first CMOS invertor; and a fourth NMOS transistor having a gate connected to the gate of the third NMOS transistor, a drain being connected to the voltage source, and a source connected to the positive end of the second CMOS inverter.

6. A current cell according to claim 5, including a bias circuit for providing the second reference voltage, the bias circuit including:

a sixth PMOS transistor having a drain, a source connected to the voltage source and a gate to which the first reference voltage is applied;

a fifth NMOS transistor having a drain, a source and a gate connected to the drain of the sixth PMOS transistor; and a seventh PMOS transistor having a source connected to the source of the fifth NMOS transistor, and a drain and a gate which are grounded.

* * * * *